United States Patent
Park et al.

(10) Patent No.: US 12,219,723 B2
(45) Date of Patent: Feb. 4, 2025

(54) HINGED DEVICE HAVING SLOT DEFINED HINGE TRAJECTORIES

(71) Applicant: Microsoft Technology Licensing, LLC, Redmond, WA (US)

(72) Inventors: Daniel C. Park, Woodinville, WA (US); Eric Witt, Redmond, WA (US); Karsten Aagaard, Monroe, WA (US); Devin Caplow-Munro, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/840,317

(22) Filed: Jun. 14, 2022

(65) Prior Publication Data

US 2023/0403810 A1  Dec. 14, 2023

(51) Int. Cl.
*H05K 5/02* (2006.01)
*F16C 11/04* (2006.01)
*E05D 3/12* (2006.01)
*E05D 3/18* (2006.01)

(52) U.S. Cl.
CPC ............ *H05K 5/0226* (2013.01); *F16C 11/04* (2013.01); *E05D 3/122* (2013.01); *E05D 3/18* (2013.01); *E05Y 2999/00* (2024.05)

(58) Field of Classification Search
CPC ....... H05K 5/0226; F16C 11/04; E05D 3/122; E05D 3/18; E05Y 2900/606; G06F 1/1647
See application file for complete search history.

(56) References Cited

U.S. PATENT DOCUMENTS

| | | | |
|---|---|---|---|
| 7,032,984 B2 * | 4/2006 | Kim | G09F 9/30 49/383 |
| 8,611,792 B2 * | 12/2013 | Nishimura | G03G 21/1628 399/125 |
| 8,813,312 B2 * | 8/2014 | Song | G06F 1/1601 16/302 |
| 9,274,552 B2 | 3/2016 | Ahn et al. | |
| 9,372,504 B2 * | 6/2016 | Han | E05D 1/04 |
| 9,696,765 B2 * | 7/2017 | Senatori | G06F 1/1616 |
| 10,082,838 B1 * | 9/2018 | Hong | E05D 11/0081 |
| 10,082,839 B1 * | 9/2018 | Turchin | G09F 9/301 |

(Continued)

FOREIGN PATENT DOCUMENTS

CN    103941813 A    7/2014

OTHER PUBLICATIONS

"International Search Report and Written Opinion Issued in PCT Application No. PCT/US23/019532", Mailing Date: Aug. 7, 2023, 13 Pages.

(Continued)

*Primary Examiner* — Rockshana D Chowdhury
*Assistant Examiner* — Douglas R Burtner
(74) *Attorney, Agent, or Firm* — Rainier Patents, P.S.

(57) ABSTRACT

The description relates to hinged devices, such as hinged computing devices. One example can include a first portion having a first display and a second portion having a second display and a hinge assembly rotatably securing the first and second portions. The hinge assembly can define rotation of the first portion by a first pair of hinge guide pins riding in a first guide track and rotation of the second portion by a second pair of hinge guide pins riding in a second guide track.

14 Claims, 7 Drawing Sheets

(56) References Cited

U.S. PATENT DOCUMENTS

| | | | | |
|---|---|---|---|---|
| 10,100,970 | B1* | 10/2018 | Wu | H05K 5/0226 |
| 10,120,421 | B1* | 11/2018 | Hong | G06F 1/1681 |
| 10,429,896 | B2* | 10/2019 | Kuramochi | G06F 1/1681 |
| 10,466,747 | B2* | 11/2019 | Yun | G09F 9/301 |
| 10,564,682 | B1* | 2/2020 | Wu | H05K 5/0226 |
| 10,571,977 | B2* | 2/2020 | Escamilla | G06F 1/1641 |
| 10,678,305 | B1* | 6/2020 | Lee | H04M 1/022 |
| 10,782,739 | B2* | 9/2020 | Ou | F02M 35/10091 |
| 10,831,243 | B2* | 11/2020 | Kim | G06F 1/1652 |
| 10,876,337 | B2* | 12/2020 | Lin | E05D 15/06 |
| 10,912,214 | B2* | 2/2021 | Kang | H05K 5/03 |
| 11,009,061 | B2* | 5/2021 | Chang | E05D 11/06 |
| 11,596,074 | B2* | 2/2023 | Park | H05K 5/0226 |
| 11,696,415 | B2* | 7/2023 | Xie | H04M 1/0216 |
| | | | | 361/807 |
| 11,703,916 | B2* | 7/2023 | Tian | G06F 1/1616 |
| | | | | 361/679.27 |
| 11,788,331 | B2* | 10/2023 | Tsuruoka | F16C 11/045 |
| | | | | 16/357 |
| 11,797,046 | B2* | 10/2023 | Lee | G06F 1/1652 |
| 11,809,228 | B2* | 11/2023 | Hsu | G06F 1/1618 |
| 11,812,568 | B2* | 11/2023 | Xie | G06F 1/1652 |
| 2008/0049389 | A1 | 2/2008 | Kim | |
| 2012/0147535 | A1* | 6/2012 | Ahn | G06F 1/1618 |
| | | | | 361/679.01 |
| 2013/0010410 | A1* | 1/2013 | Hautamaki | H04M 1/0237 |
| | | | | 361/679.01 |
| 2015/0366089 | A1* | 12/2015 | Park | H04M 1/0268 |
| | | | | 361/679.01 |
| 2016/0349802 | A1* | 12/2016 | Ahn | G06F 1/1681 |
| 2017/0145725 | A1 | 5/2017 | Siddiqui | |
| 2017/0277225 | A1* | 9/2017 | Yeom | G06F 1/1677 |
| 2017/0308216 | A1* | 10/2017 | Lee | G06F 3/1423 |
| 2018/0164855 | A1* | 6/2018 | Tazbaz | G06F 1/1641 |
| 2018/0266154 | A1* | 9/2018 | Zhang | E05D 7/00 |
| 2018/0313399 | A1* | 11/2018 | Nakamura | G06F 1/1681 |
| 2019/0033920 | A1* | 1/2019 | Yun | G06F 1/1641 |
| 2019/0090363 | A1* | 3/2019 | Bi | H05K 5/0017 |
| 2020/0029449 | A1* | 1/2020 | Makinen | G06F 1/1681 |
| 2020/0409431 | A1* | 12/2020 | Fan | H04M 1/0268 |
| 2020/0413557 | A1* | 12/2020 | Zhang | E05D 3/122 |
| 2021/0055764 | A1* | 2/2021 | Chi | G06F 1/1647 |
| 2021/0207648 | A1* | 7/2021 | Chen | H05K 5/0226 |
| 2021/0307186 | A1* | 9/2021 | Hong | H04M 1/0216 |
| 2021/0325937 | A1* | 10/2021 | Siddiqui | G06F 1/1679 |
| 2021/0397226 | A1 | 12/2021 | Siddiqui | |
| 2022/0019260 | A1* | 1/2022 | Kang | G06F 1/1698 |
| 2022/0100239 | A1* | 3/2022 | Siddiqui | G06F 1/1641 |
| 2022/0174830 | A1* | 6/2022 | Li | H04M 1/022 |
| 2022/0217859 | A1* | 7/2022 | Lee | G06F 1/1681 |
| 2022/0291825 | A1* | 9/2022 | Ahn | G06F 1/1643 |
| 2022/0291829 | A1* | 9/2022 | Kim | G06F 1/165 |
| 2022/0346256 | A1* | 10/2022 | Kim | H04M 1/0268 |
| 2023/0152857 | A1* | 5/2023 | Ahn | G06F 1/1652 |
| | | | | 361/679.01 |
| 2023/0160417 | A1* | 5/2023 | Yu | G06F 1/1616 |
| | | | | 16/233 |
| 2023/0180403 | A1* | 6/2023 | Ahn | H05K 5/0217 |
| | | | | 361/679.01 |
| 2023/0180409 | A1* | 6/2023 | Park | G06F 1/1681 |
| | | | | 361/679.01 |
| 2023/0193947 | A1* | 6/2023 | Park | G06F 1/1681 |
| | | | | 361/807 |
| 2023/0199107 | A1* | 6/2023 | Lee | H04M 1/0237 |
| | | | | 455/566 |
| 2023/0217614 | A1* | 7/2023 | Lee | H04M 1/0237 |
| | | | | 361/807 |
| 2023/0279898 | A1* | 9/2023 | Liu | F16C 11/04 |
| | | | | 361/807 |
| 2023/0315153 | A1* | 10/2023 | Dias Duarte | G06F 1/1649 |
| | | | | 361/679.27 |
| 2024/0035324 | A1* | 2/2024 | Kim | E05D 11/105 |

OTHER PUBLICATIONS

"Lg G8x Thinq and New Lg Dual Screen Enhance Mobile Multitasking and User Enjoyment", Retrieved From: https://www.lgcorp.com/media/release/20991, Sep. 6, 2019, 4 Pages.

"ZTE Axon M", Retreived From: https://usermanual.wiki/ZTE/ZTEAxonMUserGuideEnglishPDF541MB.2988029541/view, Oct. 19, 2017, 152 Pages.

* cited by examiner

HINGED DEVICE HAVING SLOT DEFINED HINGE TRAJECTORIES

BACKGROUND

Many computer form factors such as smart phones, tablets, and notebook computers can provide enhanced functionality by folding for storage and opening for use. For instance, the folded device is easier to carry and the opened device offers more input/output area.

SUMMARY

This patent relates to hinged devices, such as hinged computing devices. One example can include a device that includes a first portion having a first display and a second portion having a second display and a hinge assembly coupling the first and second portions. The hinge assembly can define rotation of the first portion by a first pair of hinge guide pins riding in a first guide track and rotation of the second portion by a second pair of hinge guide pins riding in a second guide track. The combination of the guide pins and guide tracks can allow the displays to be positioned relatively close to one another at a 180-degree orientation of the first and second portions while protecting the displays from contacting and damaging one another at other (intermediary) orientations.

This example is intended to provide a summary of some of the described concepts and is not intended to be inclusive or limiting.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

DESCRIPTION

The present concepts relate to devices, such as computing devices employing hinge assemblies that can rotationally secure first and second device portions. Many of these devices include displays on the first and/or second portions. In some orientations, such as a 180-degree 'open book' orientation, visual content can be displayed collectively across both displays. In such scenarios, a wide gap between the displays can be distracting to the user and diminish the user experience. The present hinge assemblies can provide a technical solution that allows the displays to be relatively close together in the 180-degree orientation without the displays running into each other and causing damage at other orientations. Toward this end, the device can entail guide tracks and hinge guide pins (hinge pins) that travel in the guide tracks during the range of rotation to allow the displays to be relatively close together in the 180-degree orientation and relatively far apart (e.g., far enough to avoid damage) during other orientations. These and other aspects are described below by way of example.

Figure 1A:
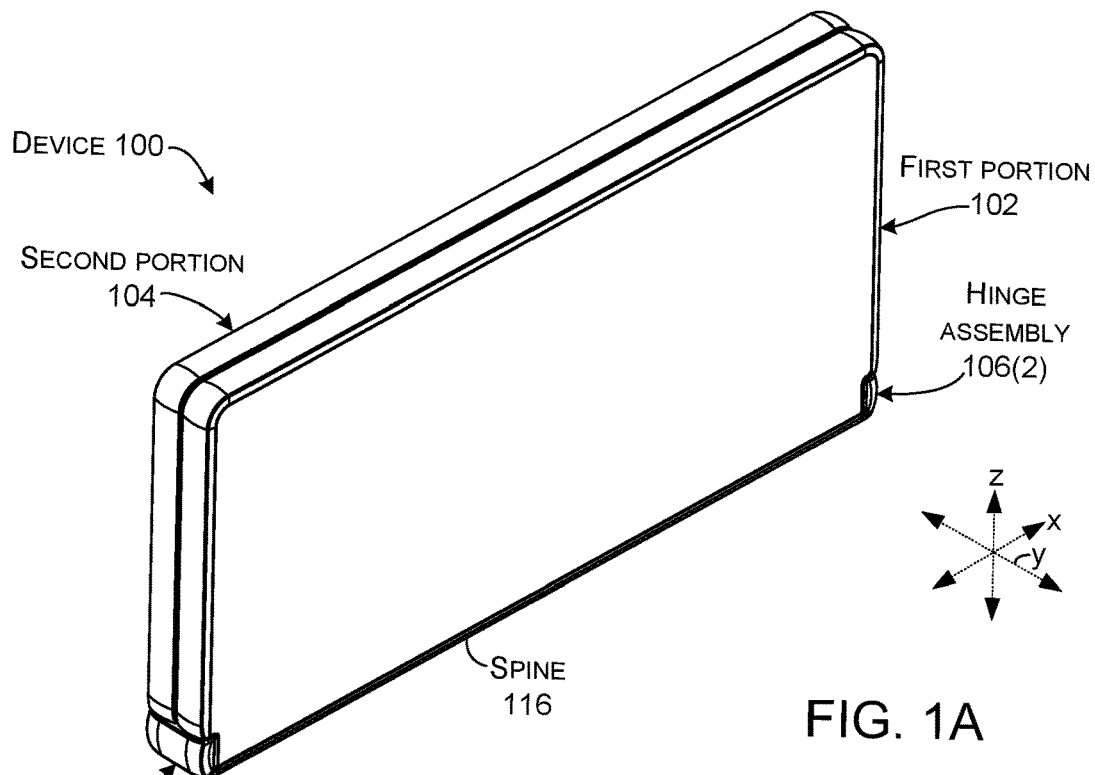
FIGS. 1A-1C, 2A, 4A, and 4B show perspective views of example devices in accordance with some implementations of the present concepts.
Figure 1B:
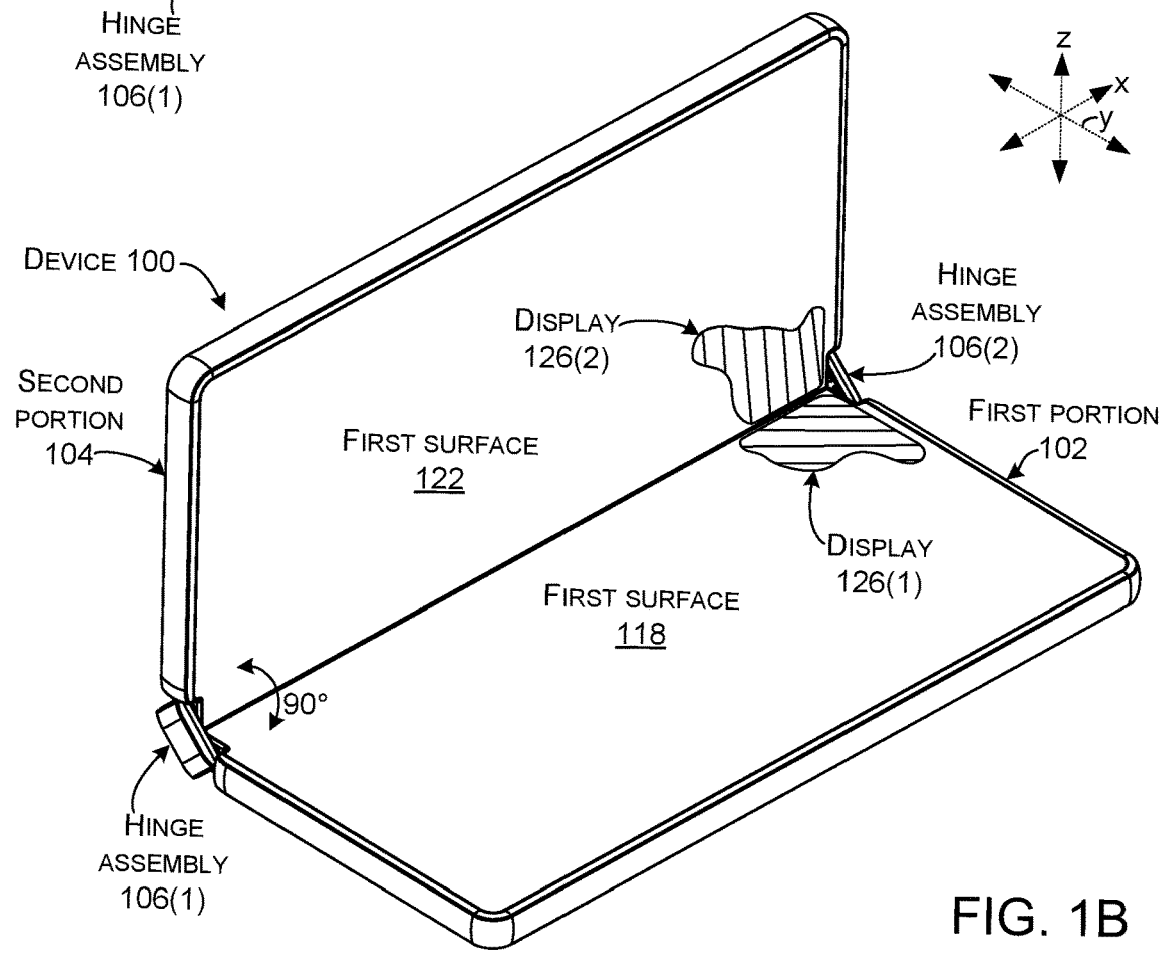
Figure 1C:
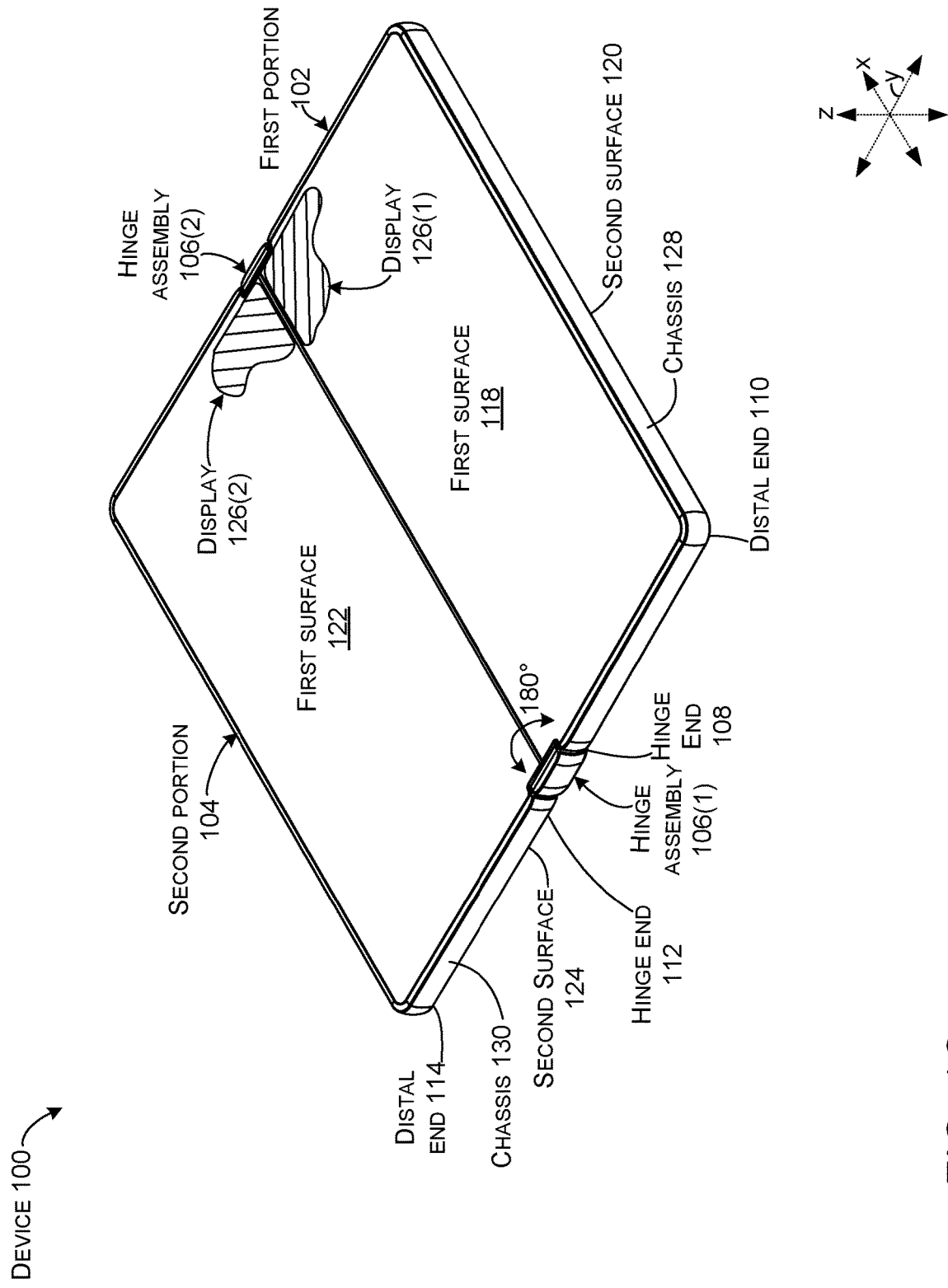

Introductory FIGS. 1A-1C shows an example device 100 that has first and second portions 102 and 104 that are rotatably secured together by opposing hinge assemblies 106 through a range of orientations. FIG. 1A shows the device in a 'closed' or approximately zero-degree orientation. As used herein the approximately zero-degree orientation can be exactly zero degrees and can also include orientations within +/− about three degrees (e.g., −3 degrees to +3 degrees). FIG. 1B shows the device in a representative intermediary (e.g., approximately 90-degree) orientation and FIG. 1C shows the device in an approximately 180-degree orientation. As used herein the approximately 180-degree orientation can be exactly 180 degrees and can also include approximate orientations within +/− about three degrees of 180 (e.g., 177-183 degrees).

The first portion 102 can extend from a hinge end 108 to a distal end 110. The second portion 104 also can extend from a hinge end 112 to a distal end 114. The hinge end of the device between the two opposing hinge assemblies 106 can be protected by a spine 116.

The first portion 102 can include opposing first and second major surfaces 118 and 120 (hereinafter, first and second surfaces). Similarly, the second portion 104 can include opposing first and second major surfaces 122 and 124 (hereinafter, first and second surfaces). In the closed orientation of FIG. 1A, the first surfaces 118 and 122 are closed against one another.

In some implementations, the device 100 can include housing or chassis 128 associated with the first portion 102 and housing or chassis 130 associated with the second portion 104. Chassis 128 can define the first surface 118 and second surface 120 and support display 126(1). Similarly, chassis 130 can define the first surface 122 and second surface 124 and support display 126(2). In the zero-degree orientation of FIG. 1A, the chassis 128 and 130 can position the displays against one another in two parallel planes. In the 180-degree orientation of FIG. 1C, the chassis 128 and 130 can position the displays 126(1) and 126(2) adjacent to one another so their hinge ends are proximate to one another (e.g., abutting) and the displays lie in a common plane.

The hinge assemblies 106 can satisfy various design parameters, such as providing friction to maintain the device in a given orientation. For instance, if the user places the device in a 100-degree orientation, the friction provided by the hinge assemblies can maintain that orientation until the user changes it. As mentioned above, many device designs attempt to produce a thin device in the z reference direction. The present hinge assembly concepts can provide hinge assemblies 106 that satisfy design parameters related to device thickness in the z reference direction while providing sufficient friction to maintain a given orientation.

Further, the present concepts offer a technical solution of a hinge configuration that allows the displays to be relatively close together in the 180-degree orientation to enhance the user viewing experience. The relative closeness of the displays at the 180-degree orientation can be achieved without the displays 126 contacting and damaging one another at other orientations.

Figure 2A:
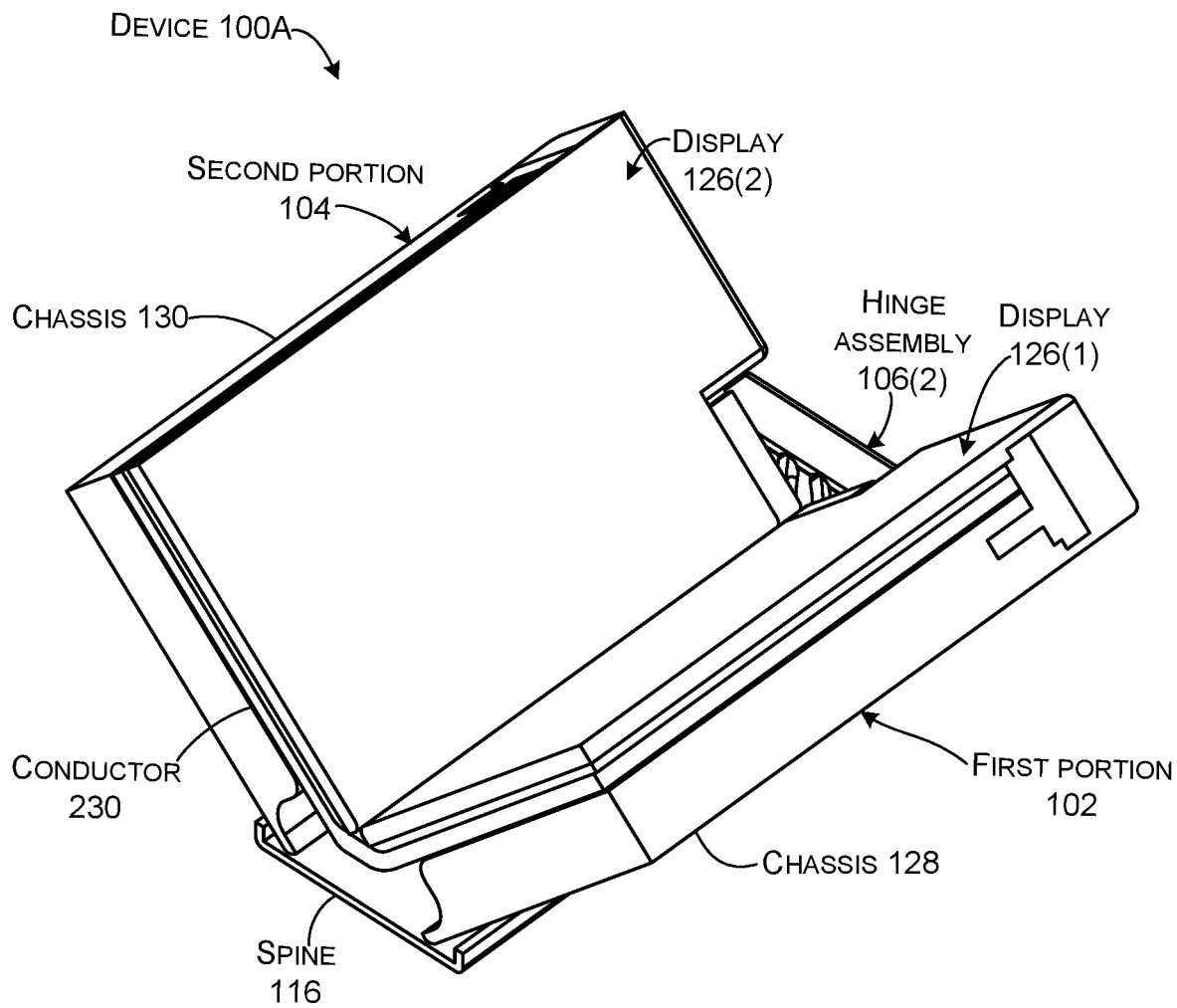
Figure 2A:
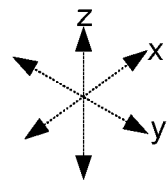
Figure 2B:
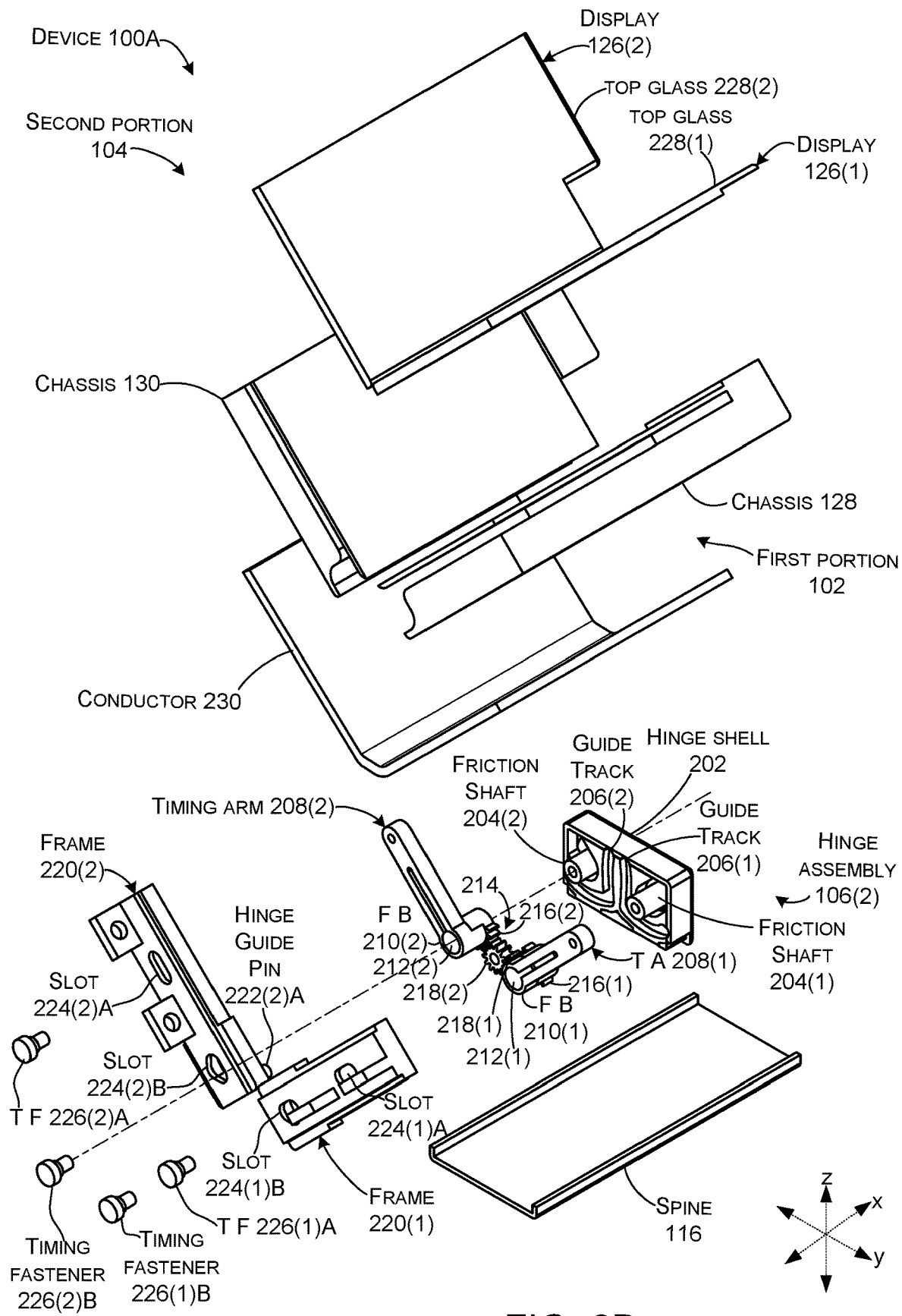
FIGS. 2B and 2C show exploded perspective views of example devices in accordance with some implementations of the present concepts.
Figure 2C:
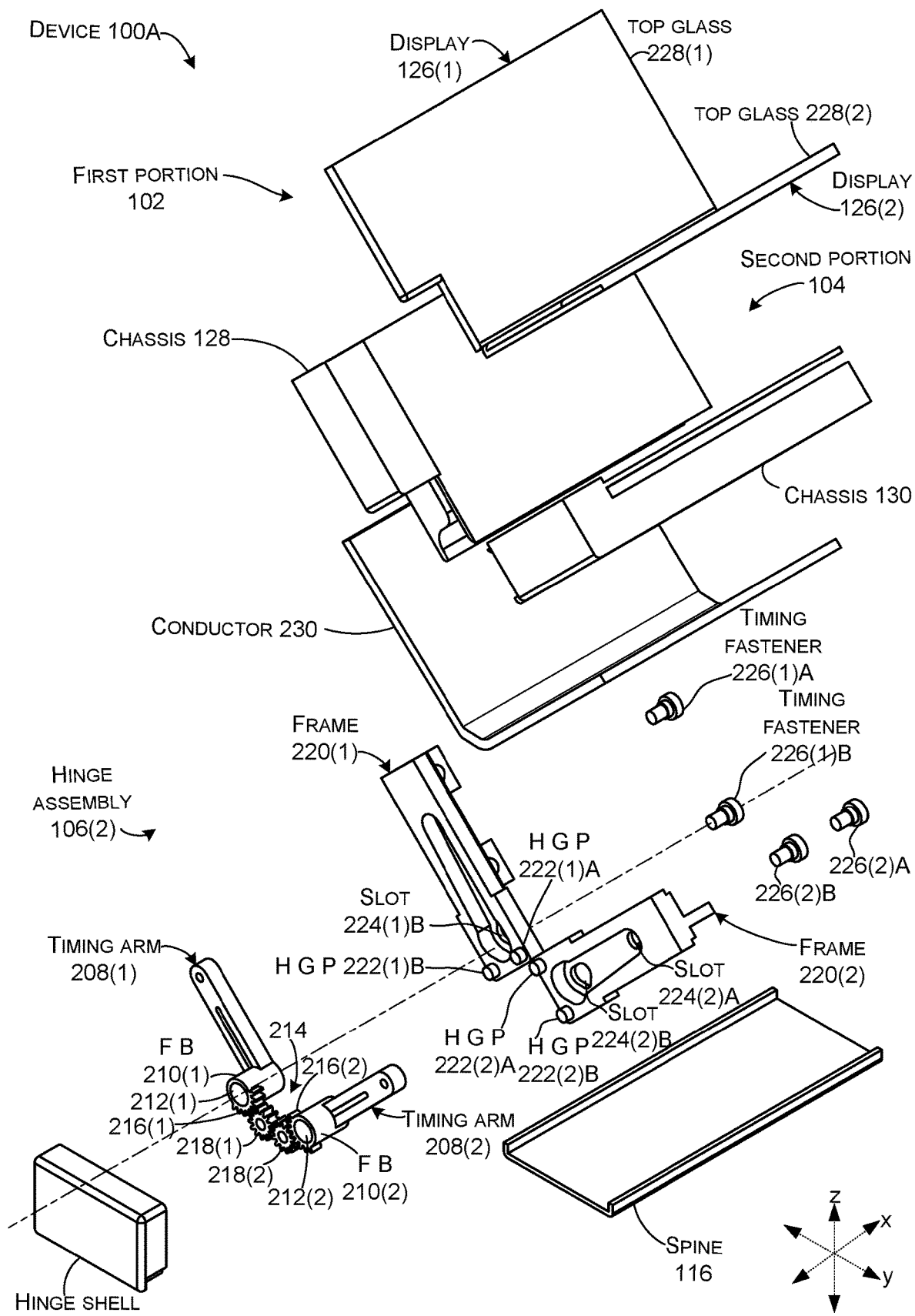

FIGS. 2A-2C collectively illustrate portions of another example device 100A. The suffix "A" is used here to indicate that this device may be different from device 100 of FIGS. 1A-1C and/or devices described below. FIG. 2A is a sectioned perspective view (e.g., sectioned along the yz reference plane and viewed along the x reference axis). FIG. 2B is an exploded perspective view that is otherwise similar to FIG. 2A. FIG. 2C is an exploded perspective view looking down the x reference axis from the opposite direction compared to FIG. 2B.

In this case, device 100A can include hinge shells 202, friction shafts 204, guide tracks 206, timing arms 208, friction bands 210, apertures 212, synchronizing elements 214, timing gears 216, idler gears 218, frames 220, hinge guide pins 222, slots 224, and/or timing fasteners 226. The displays 126 can include top glass 228 as an upper or uppermost layer of the display. The top glass 228 will be discussed below relative to FIGS. 3A-3C. The device 100A can also include conductors 230, that can extend between the first and second portions 102 and 104 to electrically connect components across the spine 116. This aspect will be discussed below relative to FIGS. 4A and 4B.

As introduced above, the hinge assemblies 106 can include hinge shells 202. The hinge shells 202 can define guide tracks 206. Guide track 206(1) relates to the first portion 102 and guide track 206(2) relates to the second portion 104. The guide tracks 206 receive the hinge guide pins 222 of the frames 220. Stated another way, guide track 206(1) can be a shared guide track for hinge guide pins 222(1)A and 222(1)B and guide track 206(2) can be a shared guide track for hinge guide pins 222(2)A and 222(2)B. The frames 220 are secured to the chassis 128 and 130. Thus, guide track 206(1) receives hinge guide pins 222(1)A and 222(1)B and guide track 206(2) receives hinge guide pins 222(2)A and 222(2)B and this couples the frames and chassis (and the first and second portions) to the hinge assemblies 106. The hinge shells can provide a technical solution of defining rotation trajectories of the first and second portions, providing friction to the hinge, and/or protecting the synchronizing elements while occupying minimal space in the x and/or the z reference direction.

In an alternative configuration, the hinge shells 202 could define a separate guide track 206 for each hinge pin. Thus, the hinge shells 202 could define two guide tracks 206 for the two hinge guide pins 222(1)A and 222(1)B of the first portion 102 and two guide tracks for the two hinge guide pins 222(2)A and 222(2)B of the second portion 104. Further, other implementations can swap the hinge guide pins and the guide tracks. In these implementations, the hinge guide pins 222 could be defined by the hinge shells 202 and the guide tracks 206 could be defined by the frames 220.

As introduced above, in the illustrated configuration, the hinge guide pins 222(1)A and 222(1)A are defined by frame 220(1), which is in turn secured to the chassis 128 of the first portion 102. The hinge guide pins 222(1)A and 222(1)A are received in guide track 206(1). Similarly, guide track 206(2) receives hinge guide pins 222(2)A and 222(2)B. The hinge guide pins 222(2) are defined by frame 220(2), which is in turn secured to the chassis 130 of the second portion 104. (Note that mounting holes are shown on the frames 220 to secure the frames to the chassis 128 and 130, but the accompanying fasteners are omitted to reduce clutter on the drawing pages). In this configuration, the position of the hinge ends of the first and second portions (as represented here by their respective chassis) during rotation is determined by the location of the hinge guide pins 222 in the guide tracks 206. This aspect is described in more detail below relative to FIGS. 3A-3C.

Looking again at FIGS. 2A-2C, the hinge shells 202 also define friction shafts 204. The timing arms 208 include friction bands 210 that define apertures 212. The apertures 212 can be friction fit over the friction shafts 204 so that interaction of the friction shafts and friction bands creates resistance to rotation (e.g., rotating the friction bands on the friction shaft only occurs when a rotational force greater than the friction force is imparted on the first and second portions, such as by a user). The synchronizing element 214 synchronizes rotation of the two timing arms 208 so that any rotation of one friction arm produces simultaneous and equal rotation in the other friction arm. In this case, the synchronizing element 214 entails timing gears 216 defined by and around the friction bands 210 (e.g., radial gears). The timing gears 216 are intermeshed via secondary gears 218 (e.g., idler gears). Other synchronizing elements 214 are contemplated. For instance, inelastic figure eight cords could be positioned around the friction bands to synchronize rotation of the two timing arms. In these implementations, the combination of the timing arms and friction shafts and the timing arms and synchronizing elements provides a dual technical solution of creating a synchronized friction hinge.

The two directly preceding paragraphs explain how the rotation of the frames 220 (and hence the first and second portions 102 and 104) is defined by movement of the hinge guide pins 222 in the guide tracks 206 but the rotation of the timing arms 208 is defined by the friction shafts 204. The illustrated implementation facilitates relative movement (e.g., sliding) between the frames 220 and the timing arms 208. In this case, the relative movement is enabled by slots 224 in the frames 220. Timing fasteners 226 pass through the slots 224 and are secured, such as by threads to the timing arms 208 (fasteners 226(1)A and 226(2)A) and to the friction shafts 204 (fasteners 226(1)B and 226(2)B). However, the timing fasteners 226 are not fastened to the frames 220 and are able to move relative to the frames 220 within the bounds defined by the slots 224. For example, the timing fasteners 226 can be manifest as shoulder screws, among others.

Figure 3A:
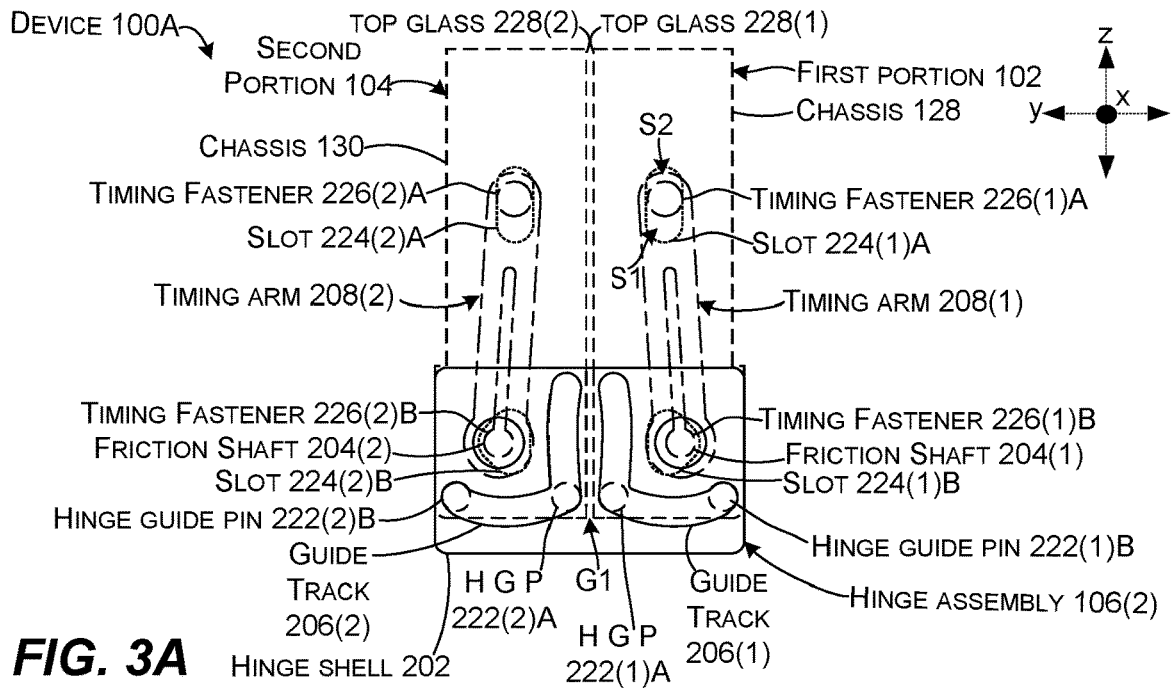
FIGS. 3A-3C show elevational views of example devices in accordance with some implementations of the present concepts.
Figure 3B:
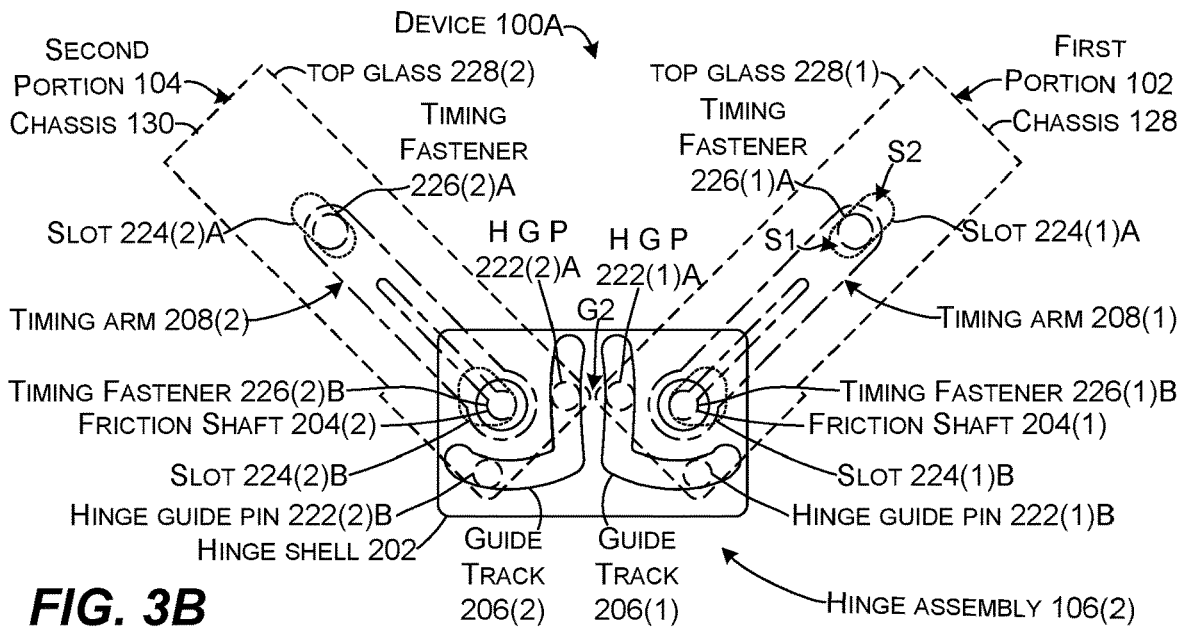
Figure 3C:
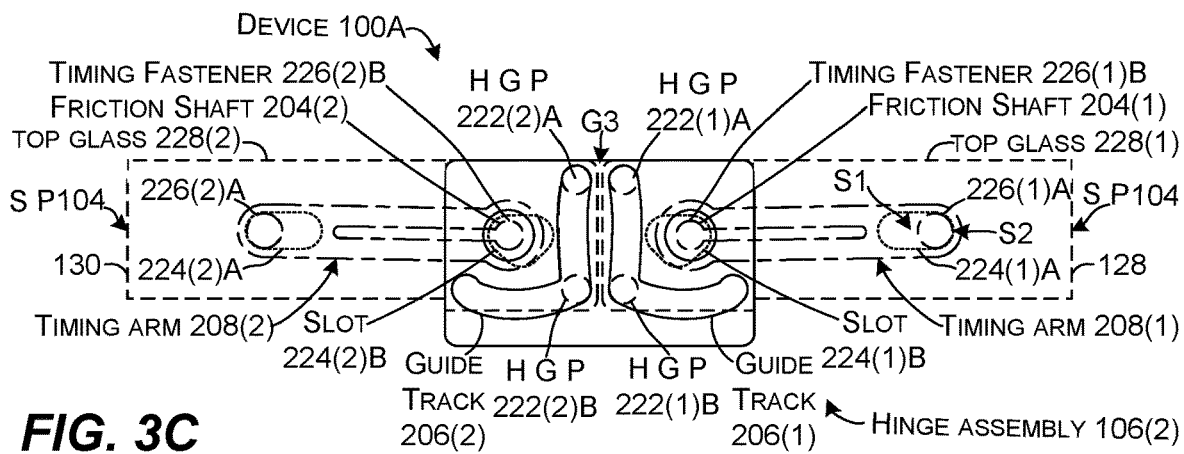

FIGS. 3A-3C collectively show a technical solution where the hinge assemblies 106 prevent the display top glasses 228(1) and 228(2) from contacting and damaging one another during rotation and also create a smaller gap between the top glasses 228(1) and 228(2) in the 180-degree orientation than at other orientations. FIGS. 3A-3C also illustrate the technical solution that allows the timing arms 208 and the chassis 128 and 130 to rotate around different axes (and/or trajectories (e.g., a plot of multiple axes)) and yet not bind against one another during the range of rotation. Stated another way, for at least some orientations, the first and second portions 102 and 104 are rotating around axes that are not coaxial with axes along which the friction shafts 204 extend. As will be explained below, the timing arms 208 can be slideably received in the first and second portions 102 and 104 to facilitate controlled (e.g., defined) relative movement.

FIG. 3A shows the first and second portions 102 and 104 in the closed orientation with the hinge assembly 106(2) toward the bottom of the drawing page and the first and second portions extending toward the top of the drawing page. Recall that the friction shafts 204 are fixed in place relative to the hinge assembly by the hinge shell 202. The timing arms 208 are positioned around the friction shafts 204 and secured by the timing fasteners 226(2)B and 226 (1)B, respectively. The timing fasteners 226(2)B, 226(2)A, 226(1)B, and 226(1)A, pass through the slots 224 of the frames 220 and are secured to the timing arms 208. Thus, the frames 220 can move (e.g., slide) relative to the timing arms 208 to an extent defined by the slots 224. At this zero-degree orientation, the frames 220 (and hence chassis 128 and 130) have moved toward the hinge assembly 106(2) as reflected by space S1 being greater than space S2 (only labeled relative to chassis 128 due to space constraints on the drawing page).

At this zero-degree orientation, hinge guide pins 222(2)B and 222(1)B are positioned at the ends of guide tracks 206. A gap G1 is shown between the inside corners (e.g., interior edges) of the top glass 228 as defined between hinge guide pin 222(2)A of chassis 130 and hinge guide pin 222(1)A of chassis 128.

FIG. 3B shows the first and second portions 102 and 104 rotated to a 90-degree orientation. Hinge guide pins 222(2)A and 222(2)B and 222(1)A and 222(1)B are generally in the middle of the guide tracks 206. The shape of the guide tracks 206 is moving the hinge guide pins and hence the chassis 128 and 130 away from the hinge shell 202 so that the inside corners of the top glasses 228 do not contact one another. As mentioned above, the inside corners are defined between hinge guide pins 222(2)A and 222(1)A. At this point, the combination of two hinge guide pins 222 per chassis and the shape of the guide tracks 206 can maintain the gap between the inside corners. In fact, in some implementations, the gap G2 can be even larger than the gap G1 of the zero-degree orientation to protect the inside corners of the top glass 228.

Note also that the movement of the chassis 128 and 130 away from the hinge shell 202 is causing the timing fasteners 226 to move in the slots 224 as reflected by the change in ratios between spaces S1 and S2 indicated on slot 224(1)A. Note also that slots 224(1)A and 224(2)A are elongate. However, slots 224(1)B and 224(2)B tend to approximate a rounded triangle. This latter shape allows the timing fasteners 226(2)B and 226(1)B to move in multiple directions to accommodate the complex motion dictated by the movement of two hinge guide pins 222 per guide track 206 and the shape of the guide tracks. When compared to the zero-degree orientation of FIG. 3A, at the 90-degree orientation of FIG. 3B the chassis 128 and 130 proximate to the hinge shell 202 have moved away from each on in the y reference direction and away from the hinge shell 202 in the z reference direction.

FIG. 3C shows the first and second portions 102 and 104 rotated to the 180-degree orientation. At this point, the portion of the guide tracks 206 encountered by the hinge guide pins 222 are relatively closer together. This moves the four hinge guide pins 222(1)A, 222(1)B, 222(2)A, and 222(2)B and hence the chassis 128 and 130 toward one another. This movement is evident as indicated by spaces S1 and S2, where the chassis 128 has moved all the way to the end of slot 224(2)A (as evidenced by timing fastener 226 (2)A being located at the distal end of the slot 224(2)A) so that space S1 is at its maximum size and space S2 is essentially zero (e.g., the timing fastener 226(2)A is at the extreme distal end of slot 224(2)A)). (While not specifically labeled due to space constraints on the drawing page, this movement can also be evidenced by the position of timing fasteners 226(1)B and 226(2)B at the distal ends of slots 224(1)B and 224(2)B, respectively).

The movement of the chassis 128 and 130 toward one another reduces the gap between them. Hence gap G3 between the inside corners of the top glass 228(1) and 228(2) can be less than at other orientations, including the illustrated zero-degree orientation and the 90-degree orientation. As mentioned above, the user is likely to want to present content collectively across both displays in the 180-degree orientation and the smaller gap G3 decreases the size of the discontinuity running through the center of the collective image. Thus, the position and shape of the guide tracks 206 in combination with the two hinge guide pins 222 in each chassis provides a technical solution for decreasing/minimizing the display gap in the 180-degree orientation and maintaining or increasing the gap at other orientations to protect the displays. The implementation also provides a technical solution of enabling and guiding this movement while functioning as a friction hinge, by allowing relative movement between the friction and synchronizing elements (e.g., friction shaft 204, timing arms 208, and the synchronizing element 214) collectively relative to frames 220 and hence the chassis 128 and 130 to which the frames are connected.

Figure 4A:
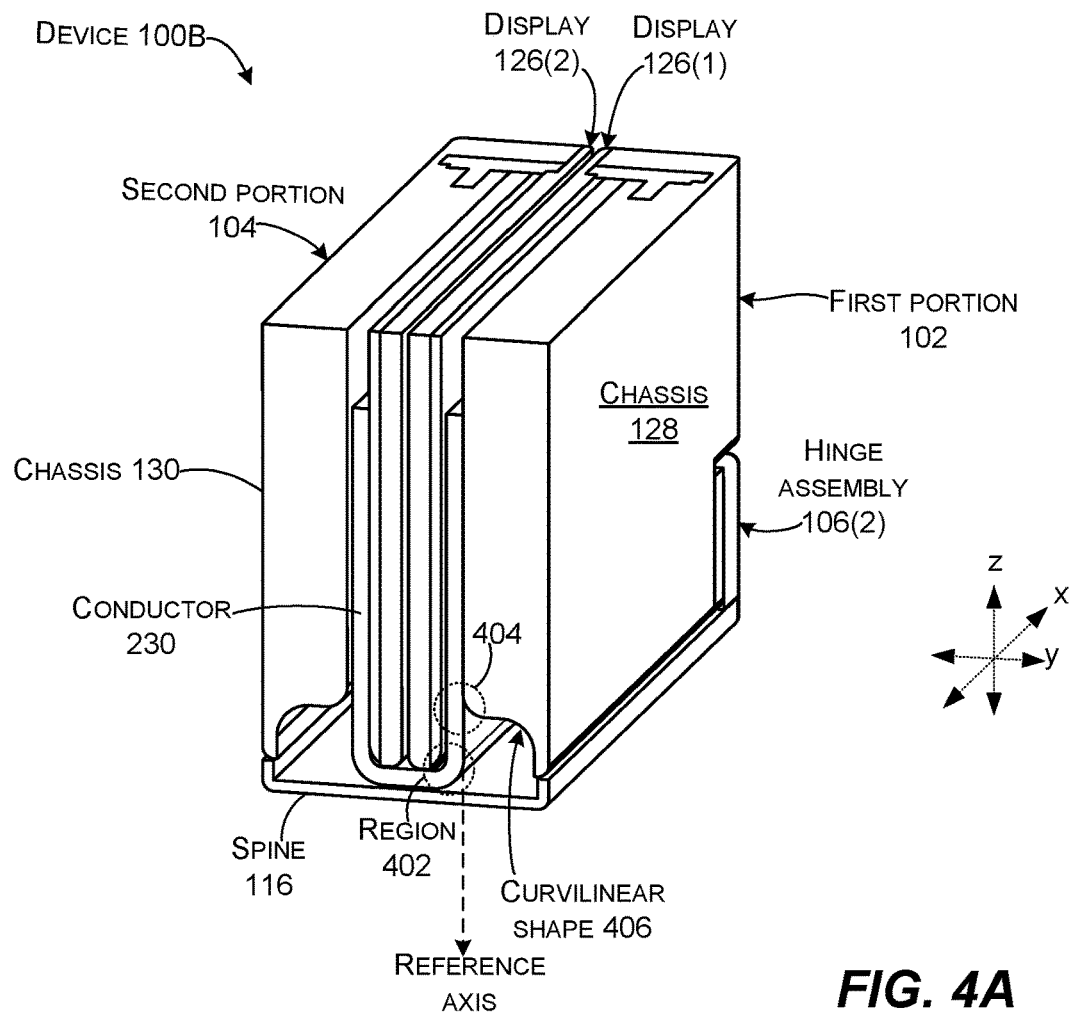
Figure 4B:
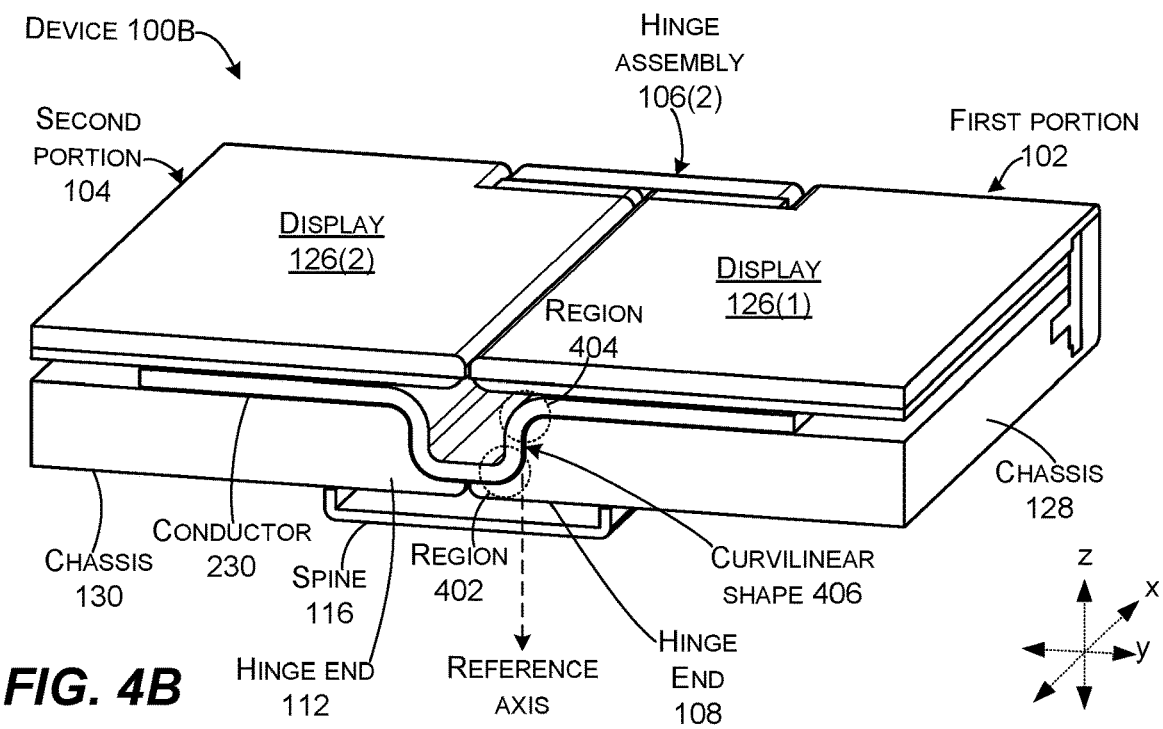

FIGS. 4A and 4B collectively show portions of another example device 100B that has a range of rotation of 180 degrees as defined by hinge assembly 106(2). The spine 116 can extend between opposing hinge assemblies 106(1) and 106(2). Only hinge assembly 106(2) is shown in these partial views. The spine 116 can cover and protect the hinge ends 108 and 112 of the first and second portions 102 and 104 through the range of orientations of the device. Conductor 230, such as a flexible printed circuit (FPC), can span between the first and second portions under the protection offered by the spine 116. This allows the conductor 230 to electrically connect elements, such as displays, batteries, processors, etc. on the first and second portions 102 and 104.

FIG. 4A shows the device 100B in the closed orientation and FIG. 4B shows the device 100B in the 180-degree orientation. Traditionally, when conductors pass through a hinge they were set up in a linear (e.g., straight) configuration along an axis and then bent in both directions when the device is opened and closed. For instance, the conductor can start at the linear configuration, be bent to positive 90 degrees in a positive direction, back through straight and then to negative 90 degrees. When this process is repeated hundreds of times, the conductors can fatigue and fail (e.g., break).

The present concepts can solve this technical problem with a technical solution where the conductor 230 and chassis 128 and 130 work cooperatively so that individual regions of the conductor only bend in one direction from the neutral or linear starting point (e.g., either in the positive direction or negative direction, but not both).

FIG. 4A highlights two regions 402 and 404 of the conductor 230. The regions 402 and 404 relate to the first portion 102 and equivalent regions that relate to the second portion 104 are shown but not specifically designated. In this closed orientation, region 402 is bent degrees relative to a reference axis. Region 404 is linear at this orientation relative to the reference axis. Note also that chassis 128 has a curvilinear shape 406 proximate to the regions 402 and 404.

FIG. 4B shows the device 100B rotated to the 180-degree orientation (e.g., 90 degrees of rotation by the first portion 102 and 90 degrees of rotation by the second portion 104). Note that region 402 has not changed relative to the reference axis and is maintaining the same bend. Region 404 has bent 90 degrees relative to the reference axis. Now both regions 402 and 404 are supported by the curvilinear shape 406 of the chassis 128. A bend radius of region 402 is supported by the curvilinear shape 406 to stabilize the conductor 230 and reduce any further bending (e.g., sharp bends) or potential kinking. Similarly, a bend radius of region 404 is defined by the curvilinear shape 406 to avoid pinching or kinking of the conductor 230.

The first and second portions 102 and 104 can now be rotated back towards the zero-degree orientation of FIG. 4A. Region 404 will return from 90 degrees of bend back to zero bend relative to the reference axis. Region 402 will continue to maintain its 90 degrees of bend relative to the reference axis. All conductor bending can occur at regions 402 and 404, but neither region is subject to bending in both directions relative to the reference axis. Region 402 maintains 90 degrees of bend throughout the range of rotation and region 404 transitions from straight (e.g., zero bend) to 90 degrees of bend (e.g., +90 relative to the reference axis) and back to straight but does not experience any bending in the negative direction (e.g., relative to the reference axis). This configuration provides a technical solution of enhanced conductor reliability through a lifetime of opening and closing the first and second portions 102 and 104 of the device 100B. In some cases, this technical solution can be accomplished by pre-bending portions of the conductor and/or configuring the device so that portions of the hinge bend from zero (linear) to a positive bend or a negative bend, but not both positive and negative (e.g., alternatively positive and negative).

Individual device elements can be made from various materials, such as metals, plastics, and/or composites. These materials can be prepared in various ways, such as from formed sheet metals, die cast metals, machined metals, 3D printed materials, molded or 3D printed plastics, and/or molded or 3D printed composites, among others, and/or any combination of these materials and/or preparations can be employed.

The present hinge assembly concepts can be utilized with any type of device, such as but not limited to notebook computers, smart phones, wearable smart devices, tablets, and/or other types of existing, developing, and/or yet to be developed devices.

Various methods of manufacture, assembly, and/or use for hinge assemblies and devices are contemplated beyond those shown above relative to FIGS. 1A-4B.

Various examples are described above. Additional examples are described below. One example includes a device comprising a first portion defining a first pair of hinge guide pins and including a first display, a second portion defining a second pair of hinge guide pins and including a second display and, a hinge assembly rotatably defining a first guide track in which the first pair of hinge guide pins are received and a second guide track in which the second pair of hinge guide pins are received to secure the first and second portions through a range of orientations from a closed orientation where the first and second displays are positioned against one another through intermediary orientations to a 180-degree orientation where the first and second portions are adjacent to one another and lie in a plane, and travel of the first pair of hinge guide pins along the first guide track and the second pair of hinge guide pins along the second guide track prevent the first display from contacting the second display during the intermediary orientations of the range of orientations.

Another example can include any of the above and/or below examples where the hinge assembly defines a first friction shaft and a second friction shaft, a first timing arm having an aperture that is friction fit around the first friction shaft and slideably received in the first portion and a second timing arm having an aperture that is friction fit around the second friction shaft and slideably received in the second portion.

Another example can include any of the above and/or below examples where the first timing arm and the second timing arm are synchronized so that rotation of the first timing arm around the first friction shaft produces a simultaneous and equal rotation of the second timing arm around the second friction shaft.

Another example can include any of the above and/or below examples where the first timing arm and the second timing arm are synchronized by intermeshing radial gears positioned around the aperture of the first timing arm and the aperture of the second timing arm.

Another example can include any of the above and/or below examples where the radial gears directly intermesh or wherein the radial gears intermesh with intermeshing secondary gears.

Another example can include any of the above and/or below examples where the first and second timing arms rotate around the first and second friction shafts along a different trajectory than defined for the first and second portions by the first pair of hinge guide pins along the first guide track and the second pair of hinge guide pins along the second guide track.

Another example can include any of the above and/or below examples where the first and second timing arms slide relative to the first and second portions during rotation.

Another example can include any of the above and/or below examples where the trajectory defined for the first and second portions by the first pair of hinge guide pins along the first guide track and the second pair of hinge guide pins along the second guide track causes opposing interior edges of the displays to be closer to one another at the 180-degree orientation than at the intermediary orientations, or wherein the opposing interior edges of the displays are a same distance from one another at the 180-degree orientation as at the intermediary orientations, or wherein the opposing interior edges of the displays are at a greater distance from one another at the 180-degree orientation than at the intermediary orientations.

Another example can include any of the above and/or below examples where the first track comprises an individual guide track for a first hinge guide pin of the first pair of hinge guide pins and another individual guide track for a second hinge guide pin of the first pair of hinge guide pins and the second guide track comprises an individual guide track for a first hinge guide pin of the second pair of hinge guide pins and another individual guide track for a second hinge guide pin of the second pair of hinge guide pins.

Another example can include any of the above and/or below examples where the first guide track comprises a shared guide track for the first pair of hinge guide pins and the second guide track comprises a shared guide track for the second pair of hinge guide pins.

Another example can include any of the above and/or below examples where the hinge assembly comprises opposing hinge shells that define the first and second guide tracks and further comprising a spine that extends between the opposing hinge shells and covers hinge ends of the first and second portions through the range of rotations.

Another example can include any of the above and/or below examples where a pre-bent conductor that is electrically connected to the first portion and extends from the first portion between the spine and the hinge ends of the first and second portions and is electrically connected to the first portion.

Another example can include any of the above and/or below examples where no portion of the pre-bent conductor is bent in both positive and negative directions relative to a reference axis during the range of rotation.

Another example includes a device comprising a first portion having a first display and a second portion having a second display, and a hinge assembly synchronizing rotation of the first and second portions from a closed zero-degree orientation through intermediary orientations to an approximately 180-degree orientation, rotation of the first portion defined at the hinge assembly by a first pair of hinge guide pins riding in a first guide track and rotation of the second portion defined at the hinge assembly by a second pair of hinge guide pins riding in a second guide track, the first and second guide tracks shaped to move the first and second portions away from one another at the intermediary orientations.

Another example can include any of the above and/or below examples where the first and second guide tracks are defined by the hinge assembly and the first pair of hinge guide pins are defined by the first portion and the second pair of hinge guide pins are defined by the second portion, or wherein the first guide track is defined by the first portion and the second guide track is defined by the second portion and the first and second pairs of hinge guide pins are defined by the hinge assembly.

Another example can include any of the above and/or below examples where a gap between the first display and the second display is smaller at the approximately 180-degree orientation than at the intermediary orientations.

Another example can include any of the above and/or below examples where portions of the first and second guide tracks in which the hinge guide pins are positioned at the approximately 180-degree orientation are closer to one another than other portions of the guide tracks.

Another example can include any of the above and/or below examples where a first friction shaft and a first friction band associated with the first portion and positioned around the first friction shaft to create resistance to rotation of the first portion and a second friction shaft and a second friction band associated with the second portion to create resistance to rotation of the second portion.

Another example can include any of the above and/or below examples where the rotation of the first portion is not coaxial with the first friction band and rotation of the second portion is not coaxial with the second friction band.

Another example includes a device comprising a first portion having a first display and a second portion having a second display, and a hinge assembly rotatably securing the first and second portions, rotation of the first portion defined at the hinge assembly by a first pair of hinge guide pins riding in a first guide track and rotation of the second portion defined at the hinge assembly by a second pair of hinge guide pins riding in a second guide track.

Another example can include any of the above and/or below examples where the first pair of hinge guide pins are defined by the hinge assembly and the first guide track is defined by the first portion and the second pair of hinge guide pins are defined by the hinge assembly and the second guide track is defined by the second portion.

Another example can include any of the above and/or below examples where the first pair of hinge guide pins are defined by the first portion and the first guide track is defined by the hinge assembly and the second pair of hinge guide pins are defined by the second portion and the second guide track is defined by the hinge assembly.

Another example can include any of the above and/or below examples where the first guide track comprises a guide track for a first hinge guide pin of the first pair of hinge guide pins and another guide track for a second hinge guide pin of the first pair of hinge guide pins and the second guide track comprises a guide track for a first hinge guide pin of the second pair of hinge guide pins and another guide track for a second hinge guide pin of the second pair of hinge guide pins.

Although techniques, methods, devices, systems, etc., pertaining to hinge assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
a first portion comprising a first display and defining a first pair of hinge guide pins at a fixed distance from one another;
a second portion comprising a second display and defining a second pair of hinge guide pins at a fixed distance from one another; and,
a hinge assembly comprising a first arcuate guide track in which the first pair of hinge guide pins are received to collectively define a first rotational trajectory of the first portion and a second arcuate guide track in which the second pair of hinge guide pins are received to collectively define a second rotational trajectory of the second portion through a range of orientations from a closed orientation where the first and second displays are positioned against one another through intermediary orientations to a 180-degree orientation where the first and second portions are adjacent to one another and lie in a plane, and travel of the first pair of hinge guide pins along the first arcuate guide track and the second pair of hinge guide pins along the second arcuate guide track produce the first rotational trajectory of the first portion and the second rotational trajectory of the second portion that prevent the first display from contacting the second display during the intermediary orientations of the range of orientations.

2. The device of claim 1, wherein the hinge assembly defines a first friction shaft and a second friction shaft, a first timing arm having an aperture that is friction fit around the first friction shaft and slideably received in the first portion and a second timing arm having an aperture that is friction fit around the second friction shaft and slideably received in the second portion.

3. The device of claim 2, wherein the first timing arm and the second timing arm are synchronized so that rotation of the first timing arm around the first friction shaft produces a simultaneous and equal rotation of the second timing arm around the second friction shaft.

4. The device of claim 3, wherein the first timing arm and the second timing arm are synchronized by intermeshing radial gears positioned around the aperture of the first timing arm and the aperture of the second timing arm.

5. The device of claim 4, wherein the radial gears directly intermesh or wherein the radial gears intermesh with intermeshing secondary gears.

6. The device of claim 5, wherein the first portion moves along the first rotational trajectory during the range of rotation and the second portion moves along the second rotational trajectory during the range of rotation, and wherein the first and second timing arms rotate around the first and second friction shafts along different trajectories than the first and second rotational trajectories defined for the first and second portions by the first pair of hinge guide pins along the first arcuate guide track and the second pair of hinge guide pins along the second arcuate guide track.

7. The device of claim 6, wherein the first and second timing arms slide relative to the first and second portions during rotation.

8. The device of claim 7, wherein the first and second rotational trajectories defined for the first and second portions by the first pair of hinge guide pins along the first arcuate guide track and the second pair of hinge guide pins along the second arcuate guide track cause opposing interior edges of the displays to be closer to one another at the 180-degree orientation than at the intermediary orientations, or wherein the opposing interior edges of the displays are at a same distance from one another at the 180-degree orientation as at the intermediary orientations.

9. A device, comprising:
a first portion configured to rotate around a first axis and having a first display and a second portion configured to rotate around a second axis and having a second display; and,
a hinge assembly synchronizing rotation of the first and second portions from a closed zero-degree orientation through intermediary orientations to an approximately 180-degree orientation, rotation of the first portion around the first axis defined at the hinge assembly by a first pair of hinge guide pins that are at a fixed distance from one another and that are parallel to the first axis and ride in a first arcuate guide track to define the first axis and rotation of the second portion around the second axis defined at the hinge assembly by a second pair of hinge guide pins that are at a fixed distance from one another and that are parallel to the second axis and ride in a second arcuate guide track to define the second axis, the first and second arcuate guide tracks shaped to move the first and second portions away from one another at the intermediary orientations.

10. The device of claim 9, further comprising a first friction shaft and a first friction band associated with the first portion and positioned around the first friction shaft to create resistance to rotation of the first portion and a second friction shaft and a second friction band associated with the second portion to create resistance to rotation of the second portion.

11. The device of claim 10, wherein rotation of the first portion around the first axis is not coaxial with the first friction band and rotation of the second portion around the second axis is not coaxial with the second friction band.

12. A device, comprising:
a first portion having a first display and a second portion having a second display; and,
a hinge assembly rotatably securing the first and second portions relative to first and second axes, rotation of the first portion defined at the hinge assembly by a first pair of hinge guide pins that are at a fixed distance from one another and that extend parallel to the first axis and ride in a first arcuate guide track and rotation of the second portion defined at the hinge assembly by a second pair of hinge guide pins that are at a fixed distance from one another and that extend parallel to the second axis and ride in a second arcuate guide track.

13. The device of claim 12, wherein the first axis moves along a first trajectory during the rotation of the first portion, and wherein the second axis moves along a second trajectory during the rotation of the second portion.

14. The device of claim 9, wherein the first axis moves along a first trajectory during the rotation of the first portion, and wherein the second axis moves along a second trajectory during the rotation of the second portion.

\* \* \* \* \*